United States Patent
Beckman et al.

(10) Patent No.: US 7,853,851 B1
(45) Date of Patent: Dec. 14, 2010

(54) METHOD AND APPARATUS FOR DETECTING DEGRADATION IN AN INTEGRATED CIRCUIT CHIP

(75) Inventors: Daniel J. Beckman, Chula Vista, CA (US); Kenny C. Cross, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1073 days.

(21) Appl. No.: 11/593,744

(22) Filed: Nov. 6, 2006

(51) Int. Cl.
*G06F 11/00* (2006.01)
(52) U.S. Cl. .................................. 714/745; 324/761
(58) Field of Classification Search ................ 704/219; 703/14; 455/307; 324/769, 761; 257/48; 714/745
See application file for complete search history.

(56) References Cited

U.S. PATENT DOCUMENTS

| | | | | |
|---|---|---|---|---|
| 4,625,286 A | * | 11/1986 | Papamichalis et al. | 704/219 |
| 5,600,578 A | * | 2/1997 | Fang et al. | 703/14 |
| 5,734,975 A | * | 3/1998 | Zele et al. | 455/307 |
| 7,106,088 B2 | * | 9/2006 | Tsai et al. | 324/769 |
| 7,220,990 B2 | * | 5/2007 | Aghababazadeh et al. | 257/48 |
| 2007/0132523 A1 | * | 6/2007 | Newman | 331/175 |

* cited by examiner

*Primary Examiner*—David Ton
(74) *Attorney, Agent, or Firm*—Park, Vaughan, Fleming & Dowler LLP

(57) ABSTRACT

A system that detects degradation in an integrated circuit chip. During operation, the system monitors a pair of pins on the integrated circuit chip and in doing so, generates a time series of parameters for the pins. The system then determines whether the time series of parameters indicates that the integrated circuit chip has degraded. If so, the system generates a signal indicating that the integrated circuit chip has degraded.

20 Claims, 2 Drawing Sheets

METHOD AND APPARATUS FOR DETECTING DEGRADATION IN AN INTEGRATED CIRCUIT CHIP

BACKGROUND

1. Field of the Invention

The present invention relates to a technique for detecting degradation in an integrated circuit chip.

2. Related Art

Electromigration is a physical process that occurs when a flow of electrons through a metal causes the metal atoms to move. For example, the flow of electrons can cause metal atoms in the leads of an integrated circuit (IC) chip to migrate through the molding resin compound used in the IC chip package. The migrating metal atoms can eventually produce an electrical short-circuit pathway between the leads which can cause the IC chip to fail. Note that the electromigration process can be accelerated by: temperature, temperature cycling, voltage differences between adjacent leads, and the presence of contaminants that can make the molding resin act as an electrolyte Electromigration poses two problems: (1) the symptoms associated with electromigration failures in IC chips are difficult to detect; and (2) a high level of "No Trouble Found" (NTF) mis-diagnoses can occur, which can be a substantial warranty cost to vendors and a significant factor for customer dissatisfaction. Electromigration-related failures can lead to high levels of NTF mis-diagnoses because the initial electrical short-circuit pathway between leads can carry enough current so that the pathway fuses (i.e., becomes an open circuit, wherein the pin-to-pin resistance returns to a high value). Hence, when the degraded IC chip is analyzed in the lab, the IC chip appears to be functioning properly even though degradation due to electromigration is present.

The only unambiguous technique for determining whether electromigration is the cause of failure in an IC chip involves performing a high-resolution X-ray analysis that can identify electromigration pathways inside the IC chip. Unfortunately, this process is costly, destructive to the IC chip, and resource-intensive.

Hence, what is needed is a method and an apparatus for detecting degradation in an integrated circuit chip without the problems described above.

SUMMARY

One embodiment of the present invention provides a system that detects degradation in an integrated circuit chip. During operation, the system monitors a pair of pins on the integrated circuit chip and in doing so, generates a time series of parameters for the pins. The system then determines whether the time series of parameters indicates that the integrated circuit chip has degraded. If so, the system generates a signal indicating that the integrated circuit chip has degraded.

In a variation on this embodiment, while determining whether the time series of parameters indicates that the integrated circuit chip has degraded, the system calculates pairwise differences between the parameters obtained from the pair of pins to produce a difference function. The system then determines whether the difference function indicates that the integrated circuit chip is has degraded.

In a further variation, while determining whether the difference function indicates that the integrated circuit chip is has degraded, the system uses a sequential probability ratio test (SPRT) to determine whether the difference function has deviated from a nominally stationary noisy process.

In a further variation, the SPRT test can include one of more of: a positive mean test, which tests whether the mean of a time series for the inferential variable is above a reference level; a negative mean test, which tests whether the mean of the time series for the inferential variable is below a reference level; a nominal variance test, which tests whether the variance of the time series for the inferential variable is proportional to a scale factor; a inverse variance test, which tests whether the variance of the time series for the inferential variable is proportional to the inverse of the scale factor; a positive first difference test, which tests whether the time series for the inferential variable is increasing; a negative first difference test, which tests whether the time series for the inferential variable is decreasing; a positive first difference variance test, which tests whether the first difference of the variance of the time series is increasing; and a negative first difference variance test, which tests whether the first difference of the variance of the time series is decreasing.

In a variation on this embodiment, the pair of pins are adjacent pins on the integrated circuit chip.

In a further variation, all pairs of adjacent pins on the integrated circuit chip are monitored.

In a variation on this embodiment, while monitoring the pair of pins, the system monitors voltages on the pair of pins.

In a variation on this embodiment, while monitoring the pair of pins, the system monitors an inter-lead impedance between the pair of pins.

In a variation on this embodiment, while determining whether the integrated circuit chip has degraded, the system determines whether electromigration has occurred between leads associated with the pair of pins.

DETAILED DESCRIPTION

Figure 1A:
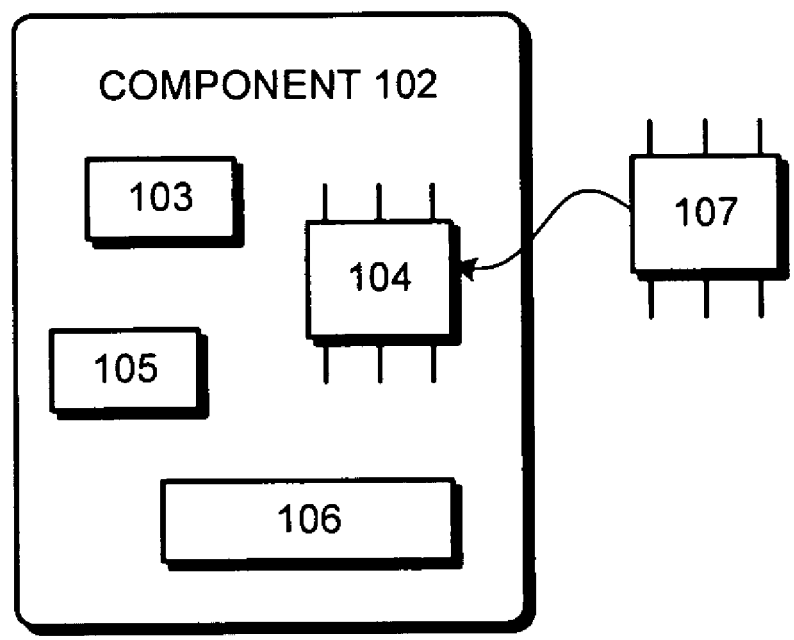
FIG. 1A illustrates a component which contains multiple IC chips and a degradation-detection device in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Overview

IC chips suffering from electromigration generally produce warning signs of impending failure due to electromigration well before the IC chip fails. Hence, one embodiment of the present invention monitors the IC chip to detect the onset of degradation caused by electromigration. Furthermore, in a variation on this embodiment, a degradation signature is recorded and is used for non-destructive root cause analysis (RCA).

In one embodiment of the present invention, a telemetry device is attached to an operating IC chip to monitor the voltages of the metal leads of the IC chip. These voltages are used to generate pin-to-pin pair-wise differences of voltages between adjacent pins to produce a set of difference functions. These difference functions constitute noisy process variables that are nominally stationary with time. In one embodiment of the present invention, the difference functions are monitored using a network of Sequential Probability Ratio Tests (SPRTs) to detect a deviation from a nominally stationary noisy process, which can indicate the onset of degradation caused by electromigration.

The flow of electrons through a metal can cause a "cobweb" structure of metal atoms to form inside the molding resin compound between the metal leads of an IC chip package. The cobweb structure can eventually yield a "thread" of metal atoms that spans the gap between adjacent leads. When this thread first completes the circuit between adjacent leads, it is typically only one atom thick. As a result, the thread produces a small decrease in resistance, and the small current that is conducted through this thread is sufficient to fuse the thread (i.e., create and open circuit). This process appears as a narrow noise spike with a small amplitude in the difference function for the monitored voltages and resistances. In one embodiment of the present invention, a SPRT alarm is triggered when this initial noise spike is observed in the difference functions.

As the electromigration process continues, more and more metal atoms increase the thickness of the short-circuit pathway. As a result, both the frequency and the amplitude of the noise spikes that appear in the difference functions increase with continued operation of the degrading IC chip. SPRT alarms are generated each time a noise spike is observed in the difference functions. Eventually the short-circuit pathway is thick enough so that a substantial drop in resistance produces a current pulse that causes the IC chip to fail.

Detecting Degradation in an IC Chip

FIG. 1A illustrates a component 102 which includes IC chips 103-106 and a degradation-detection device 107 in accordance with an embodiment of the present invention. In one embodiment of the present invention, component 102 is a hard disk drive. In one embodiment of the present invention, degradation-detection device 107 is coupled to the pins of an IC chip. For example, degradation-detection device 107 can be coupled to the pins of IC chip 104.

Figure 1B:
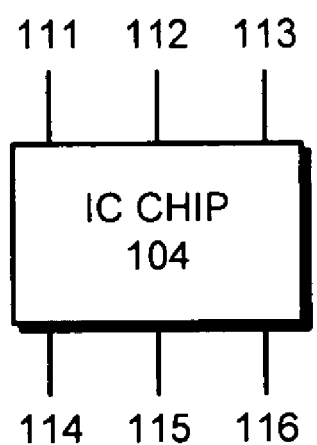
FIG. 1B illustrates an IC chip.

FIG. 1B illustrates IC chip 104, which includes pins 111-116. In one embodiment of the present invention, degradation-detection device 107 monitors the voltages and resistances between adjacent pins of IC chip 104. For example, the voltages and resistances between pin pairs 111 and 112, 112 and 113, 114 and 115, and 115 and 116 can be monitored.

Figure 2:
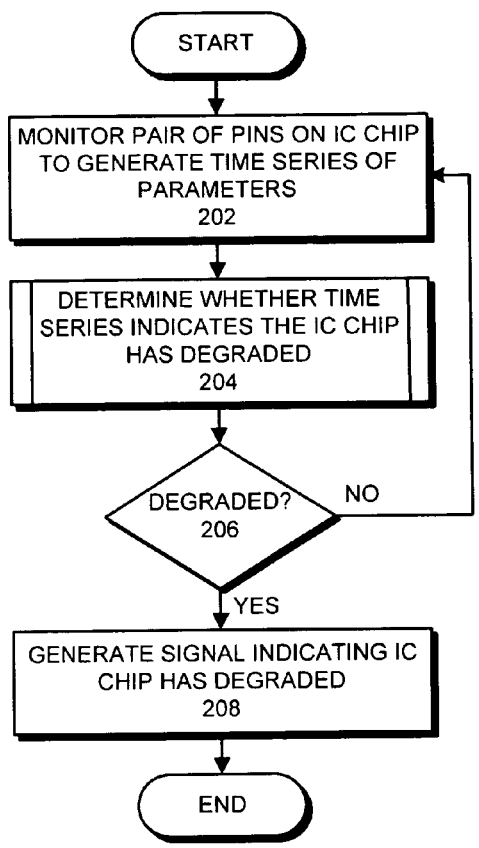
FIG. 2 presents a flow chart illustrating the process of detecting degradation in an IC chip in accordance with an embodiment of the present invention.

FIG. 2 presents a flow chart illustrating the process of detecting degradation in an IC chip in accordance with an embodiment of the present invention. The process begins when the system monitors a pair of pins on the integrated circuit chip to generate a time series of parameters for the pins (step 202). In one embodiment of the present invention, the parameters for the pins can include: a voltage on the pins, and/or an inter-lead impedance between the pair of pins.

In one embodiment of the present invention, the pair of pins are adjacent pins on the IC chip. In a variation on this embodiment, all pairs of adjacent pins on the integrated circuit chip are monitored.

The system then determines whether the time series of parameters indicates that the integrated circuit chip has degraded (step 204). (Note that step 204 is described in more detail in reference to FIG. 3 below.) If so (step 206—yes), the system generates a signal indicating that the integrated circuit chip has degraded (step 208). Otherwise, the system continues to monitor the pair of pins on the IC chip (step 202).

Figure 3:
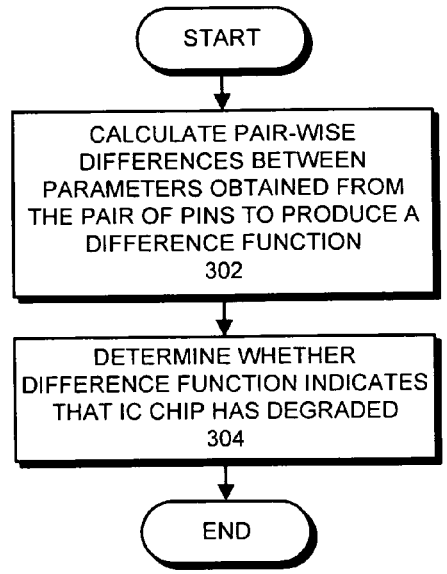
FIG. 3 presents a flow chart illustrating the process of determining whether an IC chip has degraded in accordance with an embodiment of the present invention.

FIG. 3 presents a flow chart illustrating the process of determining whether a time series of parameters for the IC chip indicates that the IC chip has degraded in accordance with an embodiment of the present invention. The process begins when the system calculates a difference function between the time series of parameters for the pair of pins (step 302). The system then determines whether the difference function indicates that the integrated circuit chip has degraded (step 304). In one embodiment of the present invention, this is accomplished by using a sequential probability ratio test (SPRT) to detect whether the difference function has deviated from a nominally stationary noisy process.

SPRT (Sequential Probability Ratio Test)

The Sequential Probability Ratio Test is a statistical hypothesis test that differs from standard fixed sample tests. In fixed-sample statistical tests, a given number of observations are used to select one hypothesis from one or more alternative hypotheses. The SPRT, however, examines one observation at a time, and then makes a decision as soon as it has sufficient information to ensure that pre-specified confidence bounds are met.

The basic approach taken by the SPRT technique is to analyze successive observations of a discrete process. Let $y_n$ represent a sample from the process at a given moment $t_n$ in time. In one embodiment of the present invention, the sequence of values $\{Y_n\}=y_0, y_1, \ldots y_n$ comes from a stationary process characterized by a Gaussian, white-noise probability density function (PDF) with mean 0. (Note that since with the sequence is from a nominally stationary processes, any process variables with a nonzero mean can be first normalized to a mean of zero with no loss of generality).

The SPRT is a binary hypothesis test that analyzes process observations sequentially to determine whether or not the signal is consistent with normal behavior. When a SPRT reaches a decision about current process behavior (i.e., the signal is behaving normally or abnormally), the system reports the decision and continues to process observations.

For each of the eight types of tandem SPRT tests described below, the signal data adheres to a Gaussian PDF with mean 0 and variance $\sigma^2$ for normal signal behavior, referred to as the null hypothesis, $H_0$. The system computes eight specific SPRT hypothesis tests in parallel for each inferential variable monitored. One embodiment of the present invention applies a SPRT to an electrical current time-series. Other embodiments of the present invention apply a SPRT to other inferential variables, including voltage, internal temperature, or stress variables.

The SPRT surveillance module executes all 8 tandem hypothesis tests in parallel. Each test determines whether the current sequence of process observations is consistent with the null hypothesis versus an alternative hypothesis. The first four tests are: (SPRT 1) the positive-mean test, (SPRT 2) the negative-mean test, (SPRT 3) the nominal-variance test, and (SPRT 4) the inverse-variance test. For the positive-mean test, the signal data for the corresponding alternative hypothesis, $H_1$, adheres to a Gaussian PDF with mean +M and variance $\sigma^2$. For the negative-mean test, the signal data for the corresponding alternative hypothesis, $H_2$, adheres to a Gaussian PDF with mean −M and variance $\sigma^2$. For the nominal-variance test, the signal data for the corresponding alternative hypothesis, $H_3$, adheres to a Gaussian PDF with mean 0 and variance $V\sigma^2$ (with scalar factor V). For the inverse-variance test, the signal data for the corresponding alternative hypothesis, $H_4$, adheres to a Gaussian PDF with mean 0 and variance $\sigma^2/V$.

The next two tandem SPRT tests are performed not on the raw inferential variables as above, but on the first difference function of the inferential variable. For discrete time series, the first difference function (i.e., difference between each observation and the observation preceding it) gives an estimate of the numerical derivative of the time series. During uninteresting time periods, the observations in the first difference function are a nominally stationary random process centered about zero. If an upward or downward trend suddenly appears in the signal, SPRTs number 5 and 6 observe an increase or decrease, respectively, in the slope of the inferential variable.

For example, if there is a decrease in the value of the inferential variable, SPRT alarms are triggered for SPRTs 2 and 6. SPRT 2 generates a warning because the sequence of raw observations drops with time. And SPRT 6 generates a warning because the slope of the inferential variable changes from zero to something less than zero. The advantage of monitoring the mean SPRT and slope SPRT in tandem is that the system correlates the SPRT readings from the eight tests and determines if the component has failed. For example, if the signal levels off to a new stationary value (or plateau), the alarms from SPRT 6 cease because the slope returns to zero when the raw signal reaches a plateau. However, SPRT 2 will continue generating a warning because the new mean value of the signal is different from the value prior to the degradation. Therefore, the system correctly identifies that the component has failed.

If SPRTs 3 or 4 generates a warning, the variance of the inferential variable is either increasing or decreasing, respectively. An increasing variance that is not accompanied by a change in mean (inferred from SPRTs 1 and 2 and SPRTs 5 and 6) signifies an episodic event that is "bursty" or "spiky" with time. A decreasing variance that is not accompanied by a change in mean is a common symptom of a failing component that is characterized by an increasing time constant. Therefore, having variance SPRTs available in parallel with slope and mean SPRTs provides a wealth of supplementary diagnostic information.

The final two tandem SPRT tests, SPRT 7 and SPRT 8, are performed on the first difference function of the variance estimates for the inferential variable. The first difference function of the variance estimates is a numerical approximation of the derivative of the sequence of variance estimates. As such, SPRT 7 triggers a warning flag if the variance of the inferential variable is increasing, while SPRT 8 triggers a warning flag if the variance of the inferential variable is decreasing. A comparison of SPRT alarms from SPRTs 3, 4, 7, and 8, gives a great deal of diagnostic information on a class of failure modes known collectively as a "change in gain without a change in mean." For example, if SPRTs 3 and 7 both trigger warning flags, it is an indication that there has been a sudden increase in the variance of the process. If SPRT 3 continues to trigger warning flags but SPRT 7 ceases issuing warning flags, it is an indication that the degradation mode responsible for the increased noisiness has gone to completion. Such information can be beneficial in root causing the origin of the degradation and eliminating it from future product designs.

Similarly, if SPRTs 4 and 8 both start triggering alarms, there is a decrease in variance for the process. If SPRT 4 continues to issue warning flags but SPRT 8 ceases issuing warning flags, it is an indication that the degradation mode has gone to completion. In safety-critical processes, this failure mode (decreasing variance without a change in mean) is dangerous in conventional systems that are monitored only by threshold limit tests. The reason it is dangerous is that a shrinking variance, when it occurs as a result of a transducer that is losing its ability to respond, never trips a threshold limit. (In contrast degradation that manifests as a linear decalibration bias, or even an increasing variance, eventually trips a high or low threshold limit and sounds a warning). A sustained decreasing variance, which happens, for example, when oil-filled pressure transmitters leak their oil, or electrolytic capacitors leak their electrolyte, never trips a threshold in conventional systems, but will be readily detected by the suite of 8 tandem SPRT tests taught in this invention.

The SPRT technique provides a quantitative framework that permits a decision to be made between the null hypothesis and the eight alternative hypotheses with specified misidentification probabilities. If the SPRT accepts one of the alternative hypotheses, an alarm flag is set and data is transmitted.

The SPRT operates as follows. At each time step in a calculation, the system calculates a test index and compares it to two stopping boundaries A and B (defined below). The test index is equal to the natural log of a likelihood ratio ($L_n$), which for a given SPRT is the ratio of the probability that the alternative hypothesis for the test ($H_j$, where j is the appropriate subscript for the SPRT in question) is true, to the probability that the null hypothesis ($H_0$) is true.

$$L_n = \frac{\text{probability of observed sequence } \{Y_n\} \text{ given } H_j \text{ is true}}{\text{probability of observed sequence } \{Y_n\} \text{ given } H_0 \text{ is true}} \quad (1)$$

If the logarithm of the likelihood ratio is greater than or equal to the logarithm of the upper threshold limit [i.e., $\ln(L_n) > \ln(B)$], then the alternative hypothesis is true. If the logarithm of the likelihood ratio is less than or equal to the logarithm of the lower threshold limit [i.e., $\ln(L_n) < \ln(A)$], then the null hypothesis is true. If the log likelihood ratio falls between the two limits, [i.e., $\ln(A) < \ln(L_n) < \ln(B)$], then there is not enough information to make a decision (and, incidentally, no other statistical test could yet reach a decision with the same given Type I and II misidentification probabilities).

Equation (2) relates the threshold limits to the misidentification probabilities $\alpha$ and $\beta$:

$$A = \frac{\beta}{1-\alpha}, \quad B = \frac{1-\beta}{\alpha} \quad (2)$$

where $\alpha$ is the probability of accepting $H_j$ when $H_0$ is true (i.e., the false-alarm probability), and $\beta$ is the probability of accepting $H_0$ when $H_j$ is true (i.e., the missed-alarm probability).

The first two SPRT tests for normal distributions examine the mean of the process observations. If the distribution of observations exhibits a non-zero mean (e.g., a mean of either +M or −M, where M is the pre-assigned system disturbance magnitude for the mean test), the mean tests determine that the system is degraded. Assuming that the sequence $\{Y_n\}$ adheres to a Gaussian PDF, then the probability that the null hypothesis $H_0$ is true (i.e., mean 0 and variance ($\sigma^2$) is:

$$P(y_1, y_2, \ldots, y_n \mid H_0) = \frac{1}{(2\pi\sigma^2)^{n/2}} \exp\left[-\frac{1}{2\sigma^2} \sum_{k=1}^{n} y_k^2\right] \quad (3)$$

Similarly, the probability for alternative hypothesis $H_1$ is true (i.e., mean M and variance $\sigma^2$) is:

$$P(y_1, y_2, \ldots, y_n \mid H_1) = \quad (4)$$
$$\frac{1}{(2\pi\sigma^2)^{n/2}} \exp\left[-\frac{1}{2\sigma^2}\left(\sum_{k=1}^{n} y_k^2 - 2\sum_{k=1}^{n} y_k M + \sum_{k=1}^{n} M^2\right)\right]$$

The ratio of the probabilities in (3) and (4) gives the likelihood ratio $L_n$ for the positive-mean test:

$$L_n = \exp\left[-\frac{1}{2\sigma^2} \sum_{k=1}^{n} M(M - 2y_k)\right] \quad (5)$$

Taking the logarithm of likelihood ratio given by (5) produces the SPRT index for the positive-mean test ($SPRT_{pos}$):

$$SPRT_{pos} = -\frac{1}{2\sigma^2} \sum_{k=1}^{n} M(M - 2y_k) = \frac{M}{\sigma^2} \sum_{k=1}^{n} \left(y_k - \frac{M}{2}\right) \quad (6)$$

The SPRT index for the negative-mean test ($SPRT_{neg}$) is derived by substituting −M for each instance of M in (4) through (6) above, resulting in:

$$SPRT_{neg} = \frac{M}{\sigma^2} \sum_{k=1}^{n} \left(-y_k - \frac{M}{2}\right) \quad (7)$$

The next two SPRT tests examine the variance of the sequence. This capability gives the SPRT module the ability to detect and quantitatively characterize changes in variability for processes, which is vitally important for 6-sigma QA/QC improvement initiatives. In the variance tests, the system is degraded if the sequence exhibits a change in variance by a factor of V or 1/V, where V, the pre-assigned system disturbance magnitude for the variance test, is a positive scalar. The probability that the alternative hypothesis $H_3$ is true (i.e., mean 0 and variance $V\sigma^2$) is given by (3) with $\sigma^2$ replaced by $V\sigma^2$:

$$P(y_1, y_2, \ldots, y_n \mid H_0) = \frac{1}{(2\pi V\sigma^2)^{n/2}} \exp\left[-\frac{1}{2V\sigma^2} \sum_{k=1}^{n} y_k^2\right] \quad (8)$$

The likelihood ratio for the variance test is given by the ratio of (8) to (3):

$$L_n = V^{-n/2} \exp\left[-\frac{1}{2\sigma^2} \frac{1-V}{V} \sum_{k=1}^{n} y_k^2\right] \quad (9)$$

Taking the logarithm of the likelihood ratio given in (9) produces the SPRT index for the nominal-variance test ($SPRT_{nom}$):

$$SPRT_{nom} = \frac{1}{2\sigma^2}\left(\frac{V-1}{V}\right) \sum_{k=1}^{n} y_k^2 - \frac{n}{2} \ln V \quad (10)$$

The SPRT index for the inverse-variance test ($SPRT_i$) is derived by substituting 1/V for each instance of V in (8) through (10), resulting in:

$$SPRT_{inv} = \frac{1}{2\sigma^2}(1-V) \sum_{k=1}^{n} y_k^2 + \frac{n}{2} \ln V \quad (11)$$

The tandem SPRT module performs mean, variance, and SPRT tests on the raw process signal and on its first difference function. To initialize the module for analysis of an inferential variable time-series, the user specifies the system disturbance magnitudes for the tests (M and V), the false-alarm probability ($\alpha$), and the missed-alarm probability ($\beta$).

Then, during the training phase (before the first failure of a component under test), the module calculates the mean and variance of the monitored variable process signal. For most inferential variables the mean of the raw observations for the inferential variable will be nonzero; in this case the mean calculated from the training phase is used to normalize the signal during the monitoring phase. The system disturbance magnitude for the mean tests specifies the number of standard deviations (or fractions thereof) that the distribution must shift in the positive or negative direction to trigger an alarm. The system disturbance magnitude for the variance tests specifies the fractional change of the variance necessary to trigger an alarm.

At the beginning of the monitoring phase, the system sets all eight SPRT indices to 0. Then, during each time step of the calculation, the system updates the SPRT indices using (6), (7), (10), and (11). The system compares each SPRT index is then compared to the upper [i.e., $\ln((1-\beta)/\alpha]$ and lower [i.e., $\ln((\beta/(1-\alpha))]$ decision boundaries, with these three possible outcomes:

1. the lower limit is reached, in which case the process is declared healthy, the test statistic is reset to zero, and sampling continues;
2. the upper limit is reached, in which case the process is declared degraded, an alarm flag is raised indicating a sensor or process fault, the test statistic is reset to zero, and sampling continues; or
3. neither limit has been reached, in which case no decision concerning the process can yet be made, and the sampling continues.

The advantages of using a SPRT are twofold:
1. early detection of very subtle anomalies in noisy process variables; and 2. pre-specification of quantitative false-alarm and missed-alarm probabilities.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for detecting degradation in an integrated circuit chip, comprising:
    monitoring a pair of pins on the integrated circuit chip to generate a time series of parameters for the pins;
    determining whether the time series of parameters indicates that the integrated circuit chip has degraded; and
    if so, generating a signal indicating that the integrated circuit chip has degraded.

2. The method of claim 1, wherein determining whether the time series of parameters indicates that the integrated circuit chip has degraded involves:
    calculating pair-wise differences between the parameters obtained from the pair of pins to produce a difference function; and
    determining whether the difference function indicates that the integrated circuit chip is has degraded.

3. The method of claim 2, determining whether the difference function indicates that the integrated circuit chip is has degraded involves using a sequential probability ratio test (SPRT) to determine whether the difference function has deviated from a nominally stationary noisy process.

4. The method of claim 3, wherein the SPRT test can include one of more of:
    a positive-mean test, which tests whether the mean of a time-series for the inferential variable is above a reference level;
    a negative-mean test, which tests whether the mean of the time-series for the inferential variable is below a reference level;
    a nominal-variance test, which tests whether the variance of the time-series for the inferential variable is proportional to a scale factor;
    a inverse-variance test, which tests whether the variance of the time-series for the inferential variable is proportional to the inverse of the scale factor;
    a positive first-difference test, which tests whether the time-series for the inferential variable is increasing;
    a negative first-difference test, which tests whether the time-series for the inferential variable is decreasing;
    a positive first-difference variance test, which tests whether the first difference of the variance of the time-series is increasing; and
    a negative first-difference variance test, which tests whether the first difference of the variance of the time-series is decreasing.

5. The method of claim 1, wherein the pair of pins are adjacent pins on the integrated circuit chip.

6. The method of claim 5, wherein all pairs of adjacent pins on the integrated circuit chip are monitored.

7. The method of claim 1, wherein monitoring the pair of pins involves monitoring voltages on the pair of pins.

8. The method of claim 1, wherein monitoring the pair of pins involves monitoring an inter-lead impedance between the pair of pins.

9. The method of claim 1, wherein determining whether the integrated circuit chip has degraded involves determining whether electromigration has occurred between leads associated with the pair of pins.

10. A computer-readable storage medium storing instructions that when executed by a computer cause the computer to perform a method for detecting degradation in an integrated circuit chip, wherein the method comprises:
    monitoring a pair of pins on the integrated circuit chip to generate a time series of parameters for the pins;
    determining whether the time series of parameters indicates that the integrated circuit chip has degraded; and
    if so, generating a signal indicating that the integrated circuit chip has degraded.

11. The computer-readable storage medium of claim 10, wherein determining whether the time series of parameters indicates that the integrated circuit chip has degraded involves:
    calculating pair-wise differences between the parameters obtained from the pair of pins to produce a difference function; and
    determining whether the difference function indicates that the integrated circuit chip is has degraded.

12. The computer-readable storage medium of claim 11, determining whether the difference function indicates that the integrated circuit chip is has degraded involves using a sequential probability ratio test (SPRT) to determine whether the difference function has deviated from a nominally stationary noisy process.

13. The computer-readable storage medium of claim 12, wherein the SPRT test can include one of more of:
    a positive-mean test, which tests whether the mean of a time-series for the inferential variable is above a reference level;
    a negative-mean test, which tests whether the mean of the time-series for the inferential variable is below a reference level;
    a nominal-variance test, which tests whether the variance of the time-series for the inferential variable is proportional to a scale factor;
    a inverse-variance test, which tests whether the variance of the time-series for the inferential variable is proportional to the inverse of the scale factor;
    a positive first-difference test, which tests whether the time-series for the inferential variable is increasing;
    a negative first-difference test, which tests whether the time-series for the inferential variable is decreasing;
    a positive first-difference variance test, which tests whether the first difference of the variance of the time-series is increasing; and
    a negative first-difference variance test, which tests whether the first difference of the variance of the time-series is decreasing.

14. The computer-readable storage medium of claim 10, wherein the pair of pins are adjacent pins on the integrated circuit chip.

15. The computer-readable storage medium of claim 14, wherein all pairs of adjacent pins on the integrated circuit chip are monitored.

16. The computer-readable storage medium of claim 10, wherein monitoring the pair of pins involves monitoring voltages on the pair of pins.

17. The computer-readable storage medium of claim 10, wherein monitoring the pair of pins involves monitoring an inter-lead impedance between the pair of pins.

18. The computer-readable storage medium of claim 10, wherein determining whether the integrated circuit chip has degraded involves determining whether electromigration has occurred between leads associated with the pair of pins.

19. An apparatus that detects degradation in an integrated circuit chip, comprising a degradation-detection mechanism configured to:
- monitor a pair of pins on the integrated circuit chip to generate a time series of parameters for the pins;
- determine whether the time series of parameters indicates that the integrated circuit chip has degraded; and
- if so, to generate a signal indicating that the integrated circuit chip has degraded.

20. The apparatus of claim 19, wherein while determining whether the time series of parameters indicates that the integrated circuit chip has degraded, the degradation-detection mechanism is configured to:
- calculate pair-wise differences between the parameters obtained from the pair of pins to produce a difference function; and to
- determine whether the difference function indicates that the integrated circuit chip is has degraded.

* * * * *

UNITED STATES PATENT AND TRADEMARK OFFICE
CERTIFICATE OF CORRECTION

| | | |
|---|---|---|
| PATENT NO. | : 7,853,851 B1 | Page 1 of 1 |
| APPLICATION NO. | : 11/593744 | |
| DATED | : December 14, 2010 | |
| INVENTOR(S) | : Daniel J. Beckman et al. | |

It is certified that error appears in the above-identified patent and that said Letters Patent is hereby corrected as shown below:

Title Page, Item (75) Inventors,
The second named inventor should read:

--Kenny C. Gross--

Signed and Sealed this
Twelfth Day of April, 2011

David J. Kappos
*Director of the United States Patent and Trademark Office*